(12) United States Patent
Chen

(10) Patent No.: US 7,825,418 B2
(45) Date of Patent: Nov. 2, 2010

(54) LIGHT EMITTING DIODE OF HIGH QUANTUM EFFICIENCY AND SYSTEM THEREOF

(75) Inventor: Ga-Lane Chen, Santa Clara, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 277 days.

(21) Appl. No.: 12/202,532

(22) Filed: Sep. 2, 2008

(65) Prior Publication Data
US 2009/0134406 A1    May 28, 2009

(30) Foreign Application Priority Data
Nov. 26, 2007    (CN)    ............ 2007 1 0202660

(51) Int. Cl.
*H01L 27/15*    (2006.01)
(52) U.S. Cl. .............. 257/79; 257/98; 257/E33.005; 257/E33.067

(58) Field of Classification Search ............... 257/79, 257/98, E33.005, E33.067
See application file for complete search history.

(56) References Cited

U.S. PATENT DOCUMENTS

| | | | |
|---|---|---|---|
| 7,265,374 B2* | 9/2007 | Lee et al. ............ | 257/13 |
| 2005/0199888 A1* | 9/2005 | Seong et al. ............ | 257/79 |
| 2005/0199895 A1* | 9/2005 | Seong et al. ............ | 257/94 |
| 2006/0278880 A1 | 12/2006 | Lee et al. | |
| 2008/0303055 A1* | 12/2008 | Seong ............ | 257/103 |

* cited by examiner

*Primary Examiner*—Trung Dang
(74) *Attorney, Agent, or Firm*—Andrew C. Cheng

(57) ABSTRACT

A light emitting diode (LED) includes a transparent substrate, a first type cladding layer, an active layer, a second type cladding layer, and first and second electrodes. The first type cladding layer is disposed on the transparent substrate. The active layer and the second electrode are juxtaposed on the first type cladding layer. The second type cladding layer is disposed on the active layer. The second electrode is disposed on the second type cladding layer. The first and second type cladding layers are doped with nanoparticles.

20 Claims, 2 Drawing Sheets

LIGHT EMITTING DIODE OF HIGH QUANTUM EFFICIENCY AND SYSTEM THEREOF

BACKGROUND

1. Technical Field

The invention relates to light emitting diodes (LEDs) and, particularly, to an LED having high quantum efficiency and a system utilizing the same.

2. Description of the Related Art

A semiconductor light emitting diode (LED) typically includes an n-type cladding layer, an active layer, and a p-type cladding layer. The active layer is sandwiched between the n-type and p-type cladding layers, which form a p-n junction therebetween. When electrically biased in the forward direction of the p-n junction, holes and electrons respectively flow from the p-type and n-type cladding layers, combine in the active layer, and release energy in the form of photons. Thereby, the semiconductor LED lights. In general, the performance of an LED is largely determined by the quantum efficiency thereof (the number of photons generated in the active layer per combination of electrons and holes).

Therefore, in order to improve the performance of the LED, it is desirable to provide an LED of high quantum efficiency and a system thereof.

SUMMARY

In an exemplary embodiment, a light emitting diode (LED) includes a transparent substrate, a first type cladding layer, an active layer, a second type cladding layer, a first electrode, and a second electrode. The first type cladding layer is disposed on the transparent substrate. The active layer and the first electrode are juxtaposed on the first type cladding layer. The second type cladding layer is disposed on the active layer. The second electrode is disposed on the second type cladding layer. The first and second type cladding layers are doped with nanoparticles.

DETAILED DESCRIPTION OF THE EMBODIMENTS

Embodiments of the present light emitting diode (LED) and system thereof will now be described in detail with reference to the accompanying drawings.

Figure 1:
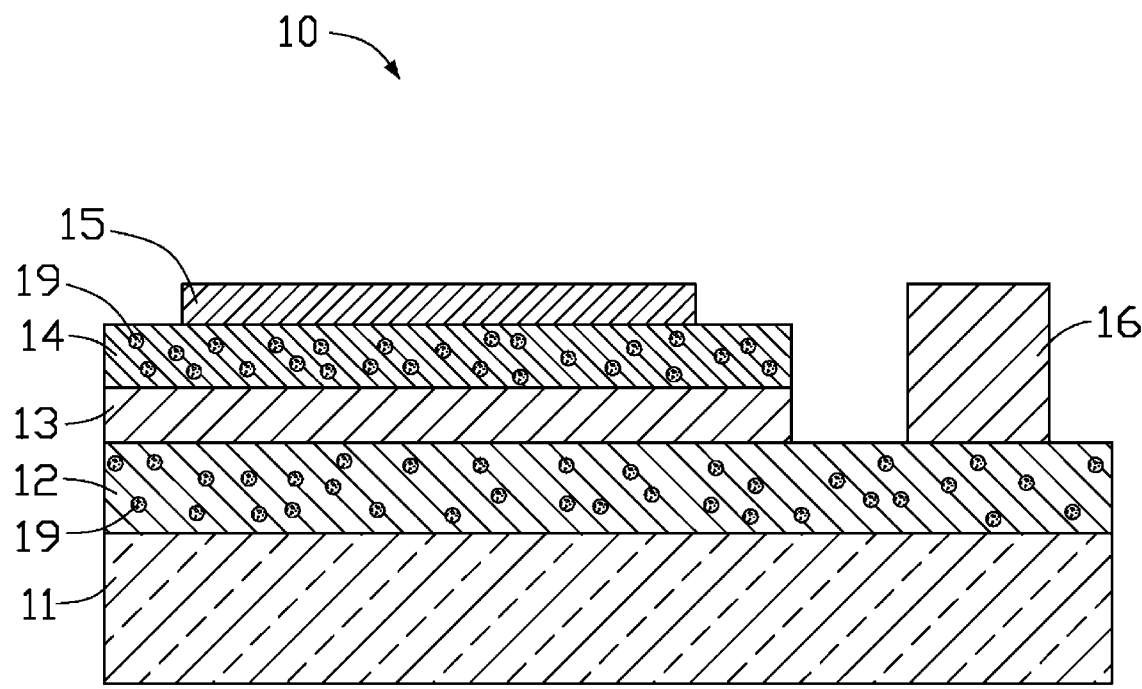
FIG. 1 is a cross-section of a light emitting diode (LED), according to an exemplary embodiment.

Referring to FIG. 1, an LED 10 in accordance with an exemplary embodiment includes a transparent substrate 11, a n-type cladding layer 12, an active layer 13, a p-type cladding layer 14, a first electrode 15, and a second electrodes 16. The n-type cladding layer 12 is disposed on the transparent substrate 11. The active layer 13 and the first electrode 15 are juxtaposed on the n-type cladding layer 12. The p-type cladding layer 14 is disposed on the active layer 13. The second electrode 16 is disposed on the p-type cladding layer 14. The n-type and p-type cladding layers 12, 14 are doped with nanoparticles 19.

The transparent substrate 11 can be made of sapphire.

The n-type cladding layer 12 can be a semiconductor material such as n-type GaN, n-type InP, n-type InGaP, or n-type AlGaInP. In this embodiment, the n-type cladding layer 12 is obtained by doping GaN with Si.

The active layer 13 can be semiconductor material such as InGaN or AlGaAs, and can be a single quantum well active layer or a multi quantum well layer.

The p-type cladding layer 14 can be semiconductor material such as p-type AlGaN or p-type AlGaAs. In this embodiment, the p-type cladding layer 14 is obtained by doping AlGaN with Mg or H.

The first and second electrodes 15, 16 can be conductive material such as Ni, Au, alloy of Ni and Au, Ti, Al, alloy of Ti and Al, Cu, Ag, alloy of Cu and Al, or alloy of Ag and Cu.

The nanoparticles 19 can be silicon oxide, silicon nitride, aluminum oxide, gallium oxide, or boron nitride. In this embodiment, the nanoparticles 19 are silicon dioxide and have diameters ranging from 20 to 200 nanometers (nm).

When manufacturing the LED 10, the n-type cladding layer 12, the active layer 13, and the p-type cladding layer 14 can first be systematically disposed using various deposition methods such as metal organic chemical vapor disposition or plasma enhanced chemical vapor deposition. Then, the first and second electrodes 15, 16 are respectively disposed on the n-type cladding layer 12 and the p-type cladding layer 14 using an available deposition method such as magnetic control sputtering. Thereby, the LED 10 is obtained.

The nanoparticles 19 doped within the n-type and p-type cladding layers 12, 14 can hinder dislocation between the n-type cladding layer 12 and the active layer 13, and between the p-type cladding layer 14 and the active layer 13, since dislocations are readily pinned due to particles. This hindering improves the crystal properties of the active layer 13, and, commensurately, quantum efficiency of the active layer 13. In addition, the nanoparticles 19 also improve the lattice constant of the n-type cladding layer 12, reducing the lattice strain on the n-type cladding layer 12. Accordingly, by adjusting the proportion of the nanoparticles 19 in the n-type cladding layer 12, desired smoothness of the n-type cladding layer 12 can be achieved. This desired smoothness of the n-type cladding layer 12 further aids subsequent achievement of desired smoothness when growing the active layer 13. The combined smoothness improves lattice mismatch between the n-type cladding layer 12 and the active layer 13, and between the p-type cladding layer 14 and the active layer 13, thereby reducing the lattice vibration effect induced in the active layer 13. The reduction of the lattice vibration effect helps to suppress the generation of phonon in the active layer 13, further improving overall quantum efficiency.

It should be understood that, in other alternative embodiments, the n-type and p-type cladding layers can be interchanged.

Figure 2:
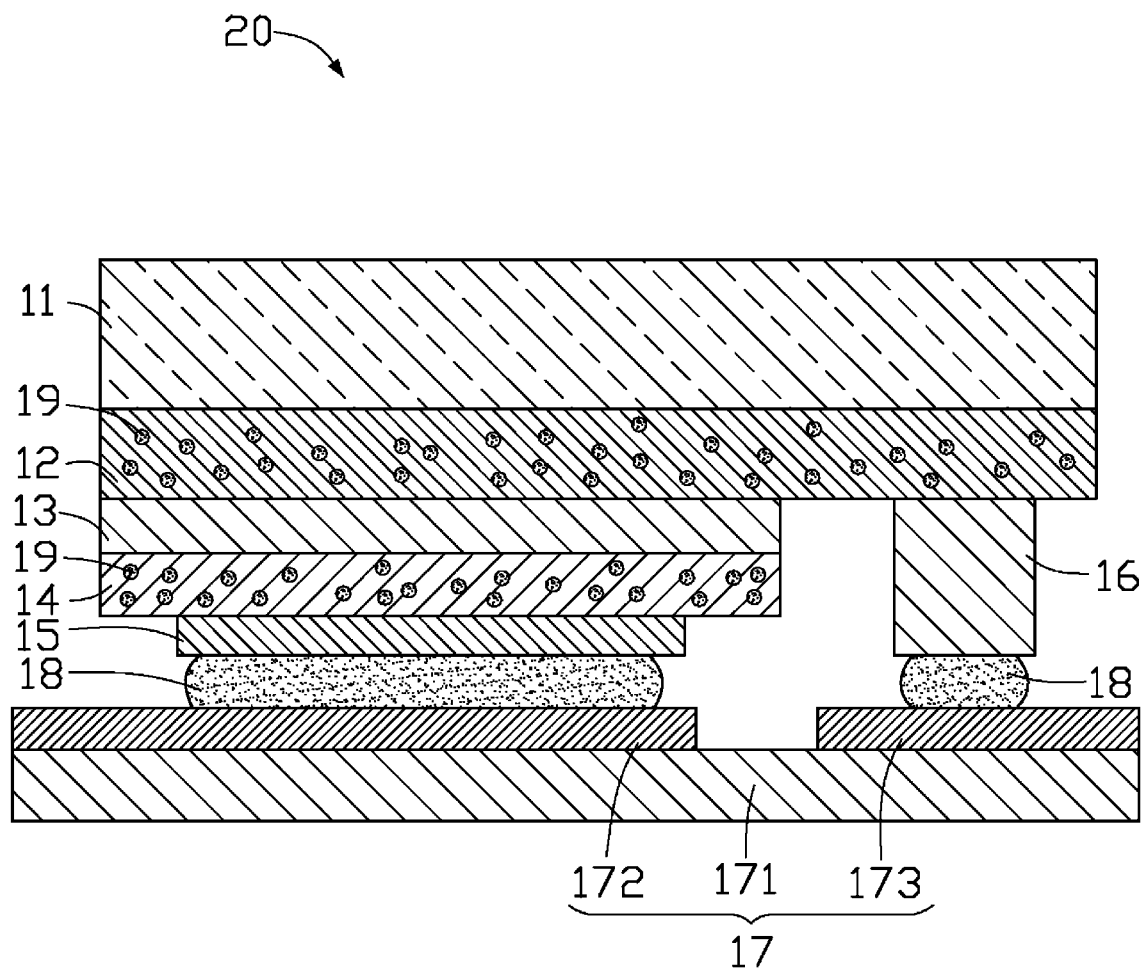
FIG. 2 is a cross-section of a system utilizing the LED of FIG. 1.

Referring to FIG. 2, a system 20 of the LED 10, according to an exemplary embodiment, includes, in addition to the described LED 10, a circuit board 17. The circuit board 17 includes an insulation layer 171, a first welding pad 172, and a second welding pad 173. The first and second welding pads 172, 173 are formed on the insulation layer 171. The LED 10 is mounted to the circuit board 17 by respectively soldering of the first welding pad 172 and the first electrode 15, and the second welding pad 173 and the second electrode 16 together. The LED 10 can then be mounted without packaging or wire boding.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. A light emitting diode comprising:
   a transparent substrate;
   a first type cladding layer disposed on the transparent substrate;
   an active layer and a first electrode juxtaposed on the first type cladding layer;
   a second type cladding layer disposed on the active layer, wherein the first and second type cladding layers are doped with nanoparticles; and
   a second electrode disposed on the second type cladding layer.

2. The light emitting diode as claimed in claim 1, wherein the transparent substrate is sapphire.

3. The light emitting diode as claimed in claim 1, wherein the first type cladding layer is of an n-type.

4. The light emitting diode as claimed in claim 1, wherein the first type layer is semiconductor material selected from the group consisting of: n-type GaN, n-type InP, n-type InGaP, and n-type AlGaInP.

5. The light emitting diode as claimed in claim 1, wherein the first type layer is GaN doped with Si.

6. The light emitting diode as claimed in claim 1, wherein the first type cladding layer is of a p-type.

7. The light emitting diode as claimed in claim 1, wherein the active layer is semiconductor material selected from the group consisting of: InGaN and AlGaAs.

8. The light emitting diode as claimed in claim 1, wherein the active layer is a single quantum well active layer or a multi quantum well layer.

9. The light emitting diode as claimed in claim 1, wherein the second type cladding layer is of a p-type.

10. The light emitting diode as claimed in claim 1, wherein the second type cladding layer is semiconductor material selected from the group consisting of: p-type AlGaN or p-type AlGaAs.

11. The light emitting diode as claimed in claim 1, wherein the second type cladding layer is AlGaN doped with a dopant selected from the group consisting of Mg or H.

12. The light emitting diode as claimed in claim 1, wherein the second type cladding layer is of an n-type.

13. The light emitting diode as claimed in claim 1, wherein the first and second electrodes are conductive material selected from the group consisting of: Ni, Au, alloy of Ni and Au, Ti, Al, alloy of Ti and Al, Cu, Ag, alloy of Cu and Al, and alloy of Ag and Cu.

14. The light emitting diode as claimed in claim 1, wherein the nanoparticles are selected from the group consisting of: silicon oxide, silicon nitride, aluminum oxide, gallium oxide, and boron nitride.

15. The light emitting diode as claimed in claim 1, wherein the nanoparticles are silicon dioxide.

16. The light emitting diode as claimed in claim 1, wherein the nanoparticles have diameters ranging from 20 to 200 nanometers.

17. A system of a light emitting diode, comprising:
   a light emitting diode comprising:
      a transparent substrate;
      a first type cladding layer disposed on the transparent substrate;
      an active layer and a first electrode juxtaposed on the first type cladding layer;
      a second type cladding layer disposed on the active layer, the first and second type cladding layers being doped with nanoparticles; and
      a second electrode disposed on the second type cladding layer; and
   a circuit board comprising:
      an insulation layer;
      a first welding pad soldered with the first electrode; and
      a second welding pad soldered with the second electrode.

18. The light emitting diode as claimed in claim 17, wherein the nanoparticles are selected from the group consisting of: silicon oxide, silicon nitride, aluminum oxide, gallium oxide, and boron nitride.

19. The light emitting diode as claimed in claim 17, wherein the nanoparticles are silicon dioxide.

20. The light emitting diode as claimed in claim 17, wherein the nanoparticles have diameters ranging from 20 to 200 nanometers.

* * * * *